(12) United States Patent
Amemiya

(10) Patent No.: US 7,397,406 B2
(45) Date of Patent: Jul. 8, 2008

(54) A/D CONVERSION CIRCUIT WITH CARRIER FREQUENCY REMOVING FEATURE

(75) Inventor: Shinichi Amemiya, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 172 days.

(21) Appl. No.: 11/507,801

(22) Filed: Aug. 22, 2006

(65) Prior Publication Data
US 2007/0057833 A1 Mar. 15, 2007

(30) Foreign Application Priority Data
Aug. 29, 2005 (JP) ............................. 2005-247043

(51) Int. Cl.
H03M 1/12 (2006.01)
(52) U.S. Cl. ....................... 341/143; 341/155
(58) Field of Classification Search ................ 341/143, 341/155, 118, 120, 200; 375/136, 142, 150
See application file for complete search history.

(56) References Cited

U.S. PATENT DOCUMENTS

| 4,081,800 | A | | 3/1978 | Amemiya |
| 4,195,283 | A | | 3/1980 | Ishikawa |
| 4,754,257 | A | | 6/1988 | Takahashi |
| 5,561,425 | A | * | 10/1996 | Therssen ................ 341/143 |
| 5,999,574 | A | * | 12/1999 | Sun et al. ................ 375/326 |
| 6,483,867 | B1 | * | 11/2002 | Mannermaa ............. 375/149 |
| 6,873,272 | B2 | | 3/2005 | Pezzini |
| 2006/0215541 | A1 | * | 9/2006 | Kwun et al. ............. 370/208 |

FOREIGN PATENT DOCUMENTS

JP 2004-057525 2/2004

* cited by examiner

Primary Examiner—Brian Young
(74) Attorney, Agent, or Firm—Armstrong Teasdale LLP

(57) ABSTRACT

The present invention is intended to fully remove a carrier-frequency component despite a compact low-cost configuration. An A/D conversion circuit with a carrier frequency removing feature includes: an A/D converter including a voltage comparator that compares a first signal with a feedback signal and a voltage feedback circuit that produces the feedback signal; a one-input N-output demultiplexer that receives the feedback signal; N integrators that calculate the respective integrals of N output signals of the demultiplexer; an N-input one-output multiplexer that receives the outputs of the N respective integrators; a subtractor that produces a difference between an analog signal and the output signal of the multiplexer; an amplifier that amplifies the output signal of the subtractor to produce the first signal; and a switching control circuit that cyclically switches the input terminals of the multiplexer and the output terminals of the demultiplexer synchronously with a carrier wave.

17 Claims, 2 Drawing Sheets

A/D CONVERSION CIRCUIT WITH CARRIER FREQUENCY REMOVING FEATURE

CROSS REFERENCE TO RELATED APPLICATIONS

This application claims the benefit of Japanese Application No. 2005-247043 filed Aug. 29, 2005.

BACKGROUND OF THE INVENTION

The present invention relates to an analog-to-digital (A/D) conversion circuit with a carrier frequency removing feature. More particularly, the present invention is concerned with an A/D conversion circuit with a carrier frequency removing feature capable of fully removing a carrier-frequency component despite a compact low-cost configuration.

Diagnostic ultrasound systems have been known in the past, wherein a baseband signal is sampled from an ultrasonic signal received in a continuous-wave Doppler mode, a highpass filter is used to remove a carrier-frequency component from the ultrasonic signal that has the baseband signal sampled therefrom, and the signal having the carrier-frequency component removed therefrom is converted into digital data by an A/D converter (refer to, for example, Patent Document 1).

[Patent Document 1] Japanese Unexamined Patent Application Publication No. 2004-57525

In the conventional diagnostic ultrasound system, a signal having a carrier-frequency component removed therefrom is converted into digital data by an A/D converter. An A/D converter designed to treat, for example, 12 bits can offer a dynamic range that is wide enough to handle a signal component having undergone a Doppler shift. A compact low-cost configuration ensues.

However, a method of removing a carrier-frequency component using a high-band filter cannot fully remove the carrier-frequency component.

SUMMARY OF THE INVENTION

Therefore, an object of the present invention is to provide an A/D conversion circuit with a carrier frequency removing feature capable of fully removing a carrier-frequency component despite a compact low-cost configuration.

According to the first aspect of the present invention, there is provided an A/D conversion circuit with a carrier frequency removing feature including: an A/D converter including a voltage comparator that compares a first signal with a feedback signal and a voltage feedback circuit that produces the feedback signal; a one-input N-output demultiplexer that receives the feedback signal; N integrators each of which calculates the integral of values represented by each of N output signals of the demultiplexer; an N-input one-output multiplexer that receives the respective output signals of the N integrators; a subtractor that produces a difference between an analog signal, which has a signal wave superposed on a carrier wave, and the output signal of the multiplexer; an amplifier that amplifies the output signal of the subtractor to produce the first signal; and a switching control circuit that cyclically switches the input terminals of the multiplexer and the output terminals of the demultiplexer synchronously with the carrier wave.

In the A/D conversion circuit with a carrier frequency removing feature according to the first aspect, a carrier wave is reproduced and removed from a received analog signal, and the resultant signal is converted into digital data. Consequently, even an A/D converter designed to treat, for example, 12 bits or 14 bits can offer a dynamic range that is wide enough to handle a component having undergone a Doppler shift. A compact low-cost configuration ensues. Even a deformed carrier wave can be fully removed.

According to the second aspect of the present invention, there is provided an A/D conversion circuit with a carrier frequency removing feature identical to the A/D conversion circuit with a carrier frequency removing feature in accordance with the first aspect except that the A/D converter is a $\Delta\Sigma$ type A/D converter.

In the A/D conversion circuit with a carrier frequency removing feature according to the second aspect, a feedback signal produced in the $\Delta\Sigma$ type A/D converter can be utilized.

According to the third aspect of the present invention, there is provided an A/D conversion circuit with a carrier frequency removing feature identical to the A/D conversion circuit with a carrier frequency removing feature in accordance with the first or second aspect except that a time constant required by the integrators is larger than the cycle of a carrier wave.

In the A/D conversion circuit with a carrier frequency removing feature according to the third aspect, each of the integrators can reproduce values represented by a carrier wave in each phase of the carrier wave.

According to the fourth aspect of the present invention, there is provided an A/D conversion circuit with a carrier frequency removing feature identical to the A/D conversion circuit with a carrier frequency removing feature in accordance with any of the first to third aspects except that the number N of integrators corresponds to a quotient of a sampling rate, which is supported by the A/D converter, by a carrier frequency.

In the A/D conversion circuit with a carrier frequency removing feature according to the fourth aspect, the action of the demultiplexer and that of the multiplexer can be synchronized with the action of the A/D converter.

According to the fifth aspect of the present invention, there is provided an A/D conversion circuit with a carrier frequency removing feature identical to the A/D conversion circuit with a carrier frequency removing feature in accordance with any of the first to fourth aspects except that a switching time at intervals of which the switching control circuit performs switching corresponds to a quotient of the cycle of a carrier wave by the number N of integrators.

In the A/D conversion circuit with a carrier frequency removing feature according to the fifth aspect, each of the integrators can reproduce values represented by a carrier wave in each phase of the carrier wave.

According to the sixth aspect of the present invention, there is provided an A/D conversion circuit with a carrier frequency removing feature identical to the A/D conversion circuit with a carrier frequency removing feature in accordance with any of the first to fifth aspects except that the switching control circuit can select any of the integrators as those to be cyclically switched.

In the A/D conversion circuit with a carrier frequency removing feature according to the sixth aspect, integrators to be employed can be selected based on a different carrier frequency.

According to the seventh aspect of the present invention, there is provided an A/D conversion circuit with a carrier frequency removing feature identical to the A/D conversion circuit with a carrier frequency removing feature in accordance with any of the first to sixth aspects except that the A/D converter is an A/D converter designed to manipulate 12 bits or 14 bits.

In the A/D conversion circuit with a carrier frequency removing feature according to the seventh aspect, the A/D conversion circuit can offer a dynamic range that is wide enough to handle a component having undergone a Doppler shift.

According to the eighth aspect of the present invention, there is provided an A/D conversion circuit with a carrier frequency removing feature identical to the A/D conversion circuit with a carrier frequency removing feature in accordance with any of the first to seventh aspects except that the A/D conversion circuit further includes a mode selection switch that selects as the first signal either the analog signal or the output signal of the subtractor.

In the A/D conversion circuit with a carrier frequency removing feature according to the eighth aspect, the A/D converter can be shared between a pulsed Doppler mode and a continuous-wave Doppler mode.

According to the ninth aspect of the present invention, there is provided an A/D conversion circuit with a carrier frequency removing feature including: an A/D converter including a voltage comparator that compares an analog signal, which has a signal wave superposed on a carrier wave, with a comparative signal and a voltage feedback circuit that produces a feedback signal; a one-input N-output demultiplexer that receives the input signal of the voltage feedback circuit; N integrators each of which calculates the integral of values represented by each of N output signals of the demultiplexer; an N-input one-output multiplexer that receives the output signals of the N respective integrators; a subtractor that produces as the comparative signal a difference between the feedback signal and the output signal of the multiplexer; and a switching control circuit that cyclically switches the input terminals of the multiplexer and the output terminals of the demultiplexer synchronously with the carrier wave.

In the A/D conversion circuit with a carrier frequency removing feature according to the ninth aspect, a carrier wave is reproduced and removed from a received analog signal, and the resultant signal is then converted into digital data by the A/D converter. An A/D converter designed to manipulate 12 or 14 bits can offer a dynamic range that is wide enough to handle a component having undergone a Doppler shift. A compact low-cost configuration ensues. Moreover, even a deformed carrier wave can be fully removed.

According to the tenth aspect of the present invention, there is provided an A/D conversion circuit with a carrier frequency removing feature identical to the A/D conversion circuit with a carrier frequency removing feature in accordance with the ninth aspect except that the A/D converter is a $\Delta\Sigma$ type A/D converter.

In the A/D conversion circuit with a carrier frequency removing feature according to the tenth aspect, a feedback signal produced in a $\Delta\Sigma$ type A/D converter can be utilized.

According to the eleventh aspect of the present invention, there is provided an A/D conversion circuit with a carrier frequency removing feature identical to the A/D conversion circuit with a carrier frequency removing feature in accordance with the ninth or tenth aspect except that the voltage feedback circuit includes an attenuator.

In the A/D conversion circuit with a carrier frequency removing feature according to the eleventh aspect, the levels a feedback signal assumes in a pulsed Doppler mode and a continuous-wave Doppler mode respectively can be adjusted, or the levels of two signals a difference of which is calculated by the subtractor can be matched.

According to the twelfth aspect of the present invention, there is provided an A/D conversion circuit with a carrier frequency removing feature identical to the A/D conversion circuit with a carrier frequency removing feature in accordance with any of the ninth to eleventh aspects except that a time constant required by the integrators is larger than the cycle of a carrier wave.

In the A/D conversion circuit with a carrier frequency removing feature according to the twelfth aspect, each of the integrators can reproduce values represented by a carrier wave in each phase of the carrier wave.

According to the thirteenth aspect of the present invention, there is provided an A/D conversion circuit with a carrier frequency removing feature identical to the A/D conversion circuit with a carrier frequency removing feature in accordance with any of the ninth to twelfth aspects except that the number N of integrators corresponds to a quotient of a sampling rate, which is supported by the A/D converter, by a carrier frequency.

In the A/D conversion circuit with a carrier frequency removing feature according to the thirteenth aspect, the action of the demultiplexer and that of the multiplexer can be synchronized with the action of the A/D converter.

According to the fourteenth aspect of the present invention, there is provided an A/D conversion circuit with a carrier frequency removing feature identical to the A/D conversion circuit with a carrier frequency removing feature in accordance with any of the ninth to thirteenth aspects except that a switching time at intervals of which the switching control circuit performs switching corresponds to a quotient of a carrier frequency by the number N of integrators.

In the A/D conversion circuit with a carrier frequency removing feature according to the fourteenth aspect, each of the integrators can reproduce values represented by a carrier wave in each phase of the carrier wave.

According to the fifteenth aspect of the present invention, there is provided an A/D conversion circuit with a carrier frequency removing feature identical to the A/D conversion circuit with a carrier frequency removing feature in accordance with any of the ninth to fourteenth aspects except that the switching control circuit can select any of the integrators as those to be cyclically switched.

In the A/D conversion circuit with a carrier frequency removing feature according to the fifteenth aspect, integrators to be employed can be selected based on a different carrier frequency.

According to the sixteenth aspect of the present invention, there is provided an A/D conversion circuit with a carrier frequency removing feature identical to the A/D conversion circuit with a carrier frequency removing feature in accordance with any of the ninth to fifteenth aspects except that the A/D converter is an A/D converter designed to manipulate 12 bits or 14 bits.

In the A/D conversion circuit with a carrier frequency removing feature according to the sixteenth aspect, the A/D converter circuit can offer a dynamic range that is wide enough to handle a component having undergone a Doppler shift.

According to the seventeenth aspect of the present invention, there is provided an A/D conversion circuit with a carrier frequency removing feature identical to the A/D conversion circuit with a carrier frequency removing feature in accordance with any of the ninth to sixteenth aspects except that the A/D conversion circuit further includes a mode selection means for selecting either the output signals of the integrators or a 0 as an input of the subtractor.

In the A/D conversion circuit with a carrier frequency removing feature according to the seventeenth aspect, the A/D converter can be shared between a pulsed Doppler mode and a continuous-wave Doppler mode.

According to an A/D conversion circuit with a carrier frequency removing feature in which the present invention is implemented, a carrier-frequency component can be fully removed despite a compact low-cost configuration.

An A/D conversion circuit with a carrier frequency removing feature in accordance with the present invention can be adapted to a diagnostic ultrasound system that supports a continuous-wave Doppler mode.

Further objects and advantages of the present invention will be apparent from the following description of the preferred embodiments of the invention as illustrated in the accompanying drawings.

DETAILED DESCRIPTION OF THE INVENTION

The present invention will be described below by taking illustrated embodiments for instance. Noted is that the present invention will not be limited to the embodiments.

First Embodiment

Figure 1:
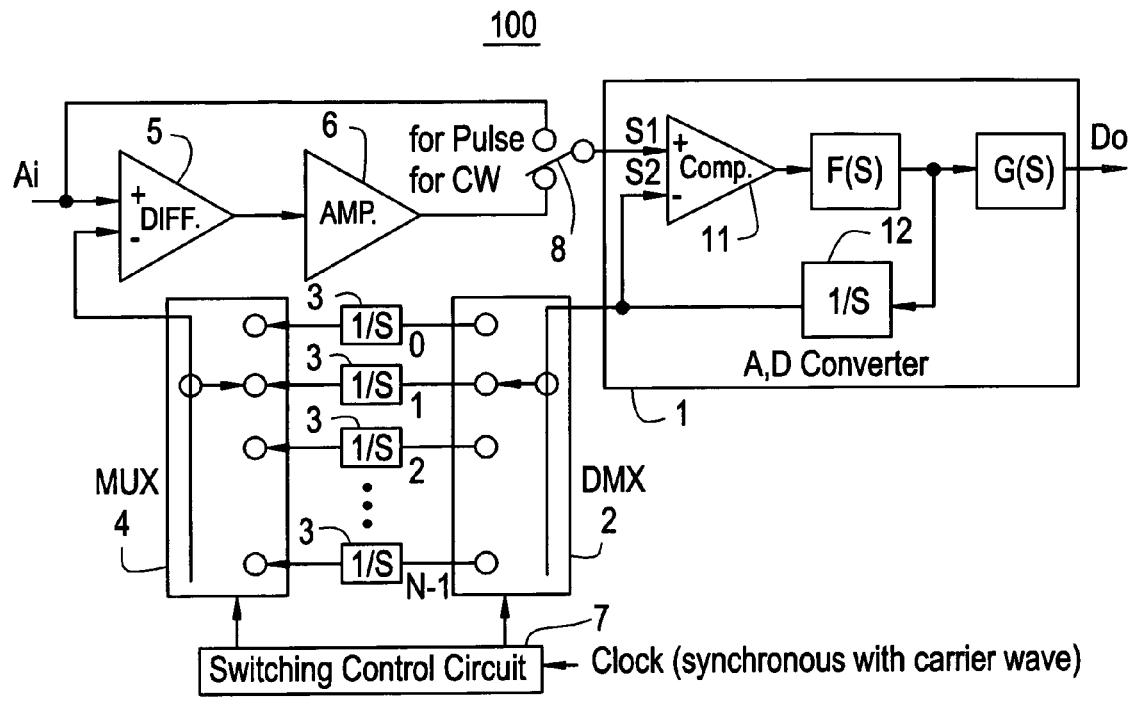
FIG. 1 is a circuit diagram showing an A/D conversion circuit with a carrier frequency removing feature in accordance with the first embodiment.

FIG. 1 is a block diagram showing an A/D conversion circuit with a carrier frequency removing feature 100 in accordance with the first embodiment.

The A/D conversion circuit with a carrier frequency removing feature 100 includes: an A/D converter 1 including a voltage comparator 11 that compares a first signal S1 with a feedback signal S2 and a voltage feedback circuit 12 that produces the feedback signal S2; a one-input M-output demultiplexer 2 that receives the feedback signal S2; M low-speed response integrators 3 each of which calculates the integral of values represented by each of M output signals of the demultiplexer 2; an M-input one-output multiplexer 4 that receives the output signals of the M respective low-speed response integrators 3; a subtractor 5 that produces a difference between an analog signal Ai, which has a signal wave Wt superposed on a carrier wave Wc, and the output signal of the multiplexer 4; an amplifier 6 that amplifies the output signal of the subtractor 5; a switching control circuit 7 that cyclically switches the output terminals of the demultiplexer 2 and the input terminals of the multiplexer 4 synchronously with the carrier wave Wc; and a mode selection switch 8 that selects as the first signal S1 either the analog signal Ai or the output signal of the subtractor 5.

The A/D converter 1 is a $\Delta\Sigma$ type A/D converter designed to manipulate 12 bits or 14 bits. In the block diagram, reference numerals F(S) and G(S) each denote a filter.

The voltage feedback circuit 12 is realized with a high-speed response integrator.

A time constant required by the low-speed response integrators 3 is larger than the cycle Tc of a carrier wave, for example, ten times larger than the cycle Tc.

The number of output terminals of the demultiplexer 2, the number of low-speed response integrators 3, and the number of input terminals of the multiplexer 4 are, for example, 20. The switching control circuit 7 can select any of the low-speed response integrators 3 as those to be cyclically switched. In other words, although the twenty low-speed response integrators 3 are included, the number N of low-speed response integrators 3 to be used in practice corresponds to a quotient of a sampling rate fs, which is supported by the A/D converter 1, by a carrier frequency fc.

For example, assuming that the sampling rate fs is 40 MHz and the carrier frequency fc is 2 MHz, since the number N of low-speed response integrators is 20, all the twenty low-response integrators 3 are employed. On the other hand, assuming that the sampling rate fs is 40 MHz and the carrier frequency fc is 4 MHz, since the number N of low-speed response integrators is 10, a half of the twenty low-speed response integrators 3 is employed.

The amplifier 6 compensates for a decrease in a signal level derived from subtraction of the output signal of the multiplexer 4 from the analog signal Ai performed by the subtractor 5. For example, if the A/D converter is designed to manipulate 12 bits, the amplification factor exhibited by the amplifier 6 shall be 16:1. If the A/D converter is designed to manipulate 14 bits, the amplification factor shall be 4:1.

Figure 2:
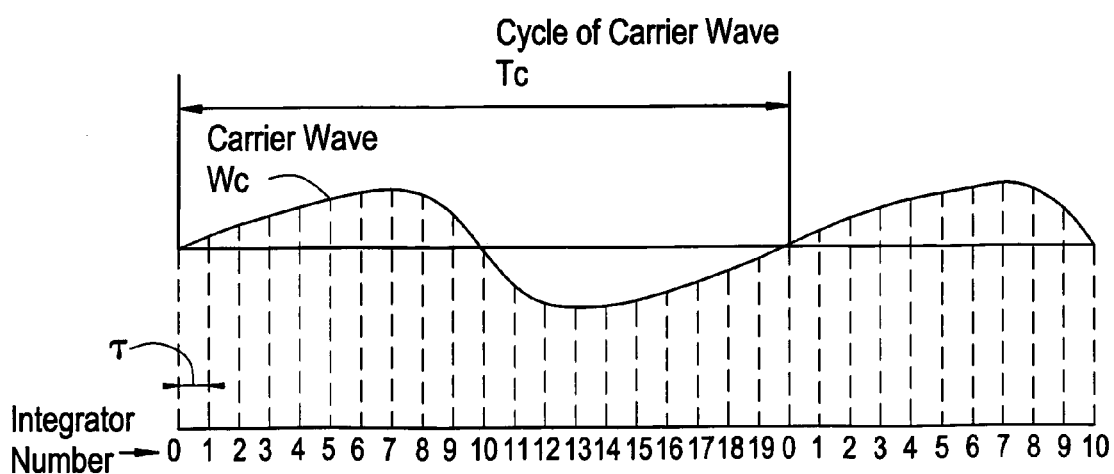
FIG. 2 is an explanatory diagram showing switching of integrators included in the A/D conversion circuit with a carrier frequency removing feature in accordance with the first embodiment.

As shown in FIG. 2, the switching control circuit 7 performs switching at intervals of a time $\tau$ calculated by dividing the cycle Tc of a carrier wave by the number N of low-speed response integrators 3. Consequently, each of the low-speed response integrators 3 holds the integral of values represented by an output signal which the demultiplexer 2 transmits in each phase of the carrier wave. However, due to the time constant required by the low-speed response integrators 3, the integral of values represented by the carrier wave Wc in each phase is substantially held.

The switching control circuit 7 cyclically performs switching synchronously with the carrier wave Wc. Consequently, the subtractor 5 subtracts the carrier wave Wc from the analog signal Ai, and the output signal of the subtractor 5 corresponds to a signal wave Wt.

Assuming that the A/D conversion circuit with a carrier frequency removing feature 100 is incorporated in a receiving system included in a diagnostic ultrasound system, the waveform of a carrier wave Wc contained in an received ultrasonic signal is deformed because of reflection in a subject's body in comparison with the waveform of a transmitted ultrasonic wave. Moreover, a rectangular wave is often adopted as a transmitted wave, and the second and third harmonics are therefore contained therein. Consequently, when a method of removing a carrier-frequency component using a notch filter as it is in a conventional art, the carrier-frequency component cannot be fully removed.

According to the present invention, even a deformed carrier wave Wc can be fully removed.

Assuming that the A/D conversion circuit with a carrier frequency removing feature 100 is incorporated in a receiving system included in a diagnostic ultrasound system, the mode selection switch 8 selects the analog signal Ai as the first signal S1 in a pulsed Doppler mode, and selects the output signal of the subtractor 5 as the first signal S1 in a continuous-wave Doppler mode.

Consequently, a dynamic range offered by the A/D converter 1 is wide enough to detect the amplitude the analog signal Ai exhibits in the pulsed Doppler mode.

The output signal of the subtractor 5 corresponds to a signal wave Wt. The signal wave Wt is a signal whose amplitude is smaller than the amplitude the analog signal Ai exhibits in the pulsed Doppler mode. If the output signal of the subtractor 5 were transferred to the A/D converter 1 as it is, the dynamic range of the A/D converter 1 would not be fully utilized. Consequently, the output signal of the subtractor 5 is amplified by the amplifier 6, and the resultant signal is regarded as the first signal S1.

In the A/D conversion circuit with a carrier frequency removing feature 100 according to the first embodiment, a signal having a carrier-frequency component removed therefrom is converted into digital data by the A/D converter 1. Consequently, even an A/D converter designed to manipulate 12 bits or 14 bits can offer a dynamic range that is wide enough to handle a component having undergone a Doppler shift. A compact low-cost configuration ensues. Even a deformed carrier wave Wc can be satisfactorily removed.

Second Embodiment

The second embodiment includes one loop, though the first embodiment includes two loops.

Figure 3:
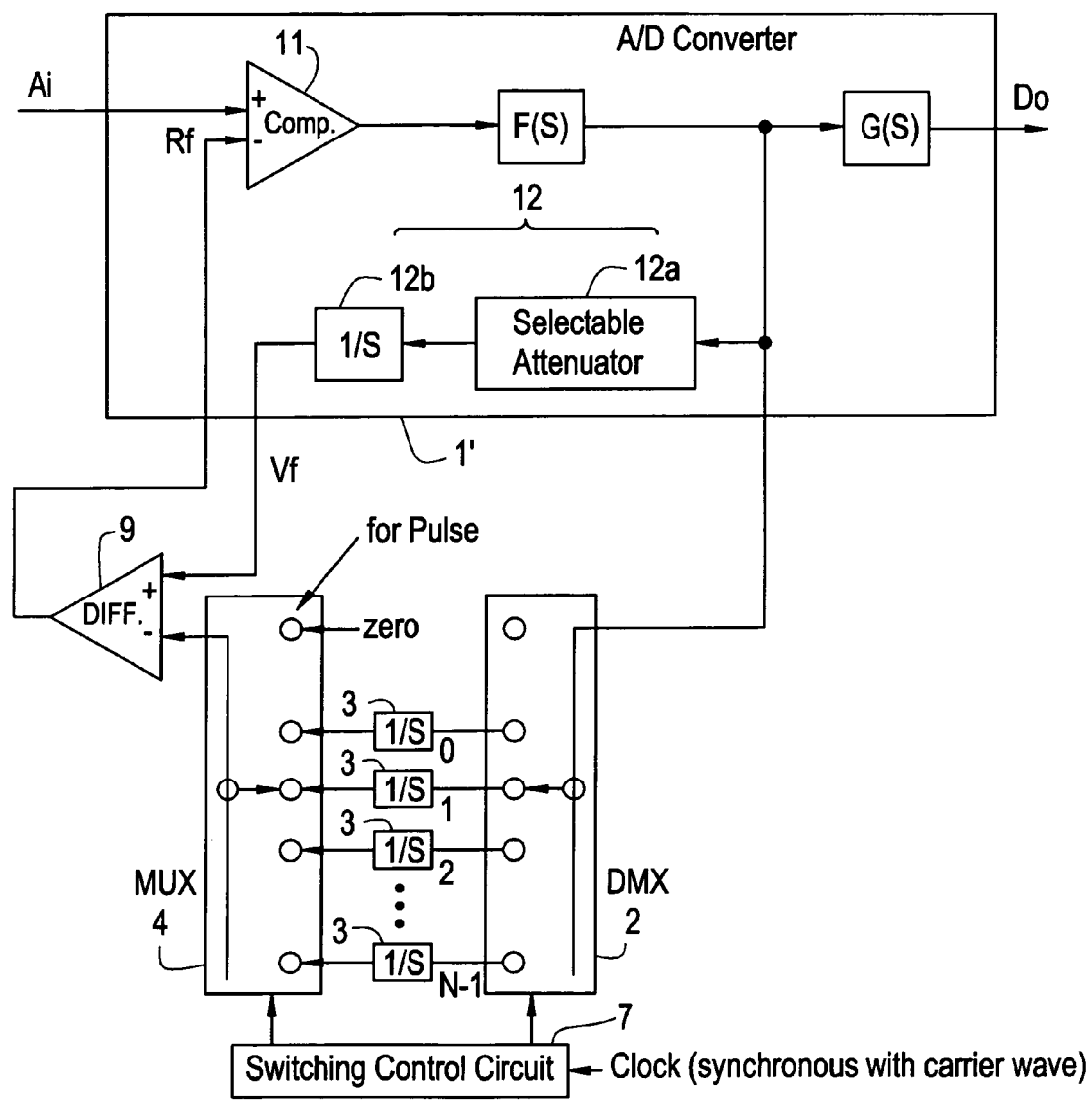
FIG. 3 is a circuit diagram showing an A/D conversion circuit with a carrier frequency removing feature in accordance with the second embodiment.

FIG. 3 is a block diagram showing an A/D conversion circuit with a carrier frequency removing feature 200 in accordance with the second embodiment.

The A/D conversion circuit with a carrier frequency removing feature 200 includes: an A/D converter 1' including a voltage comparator 11 that compares an analog signal Ai, which has a signal wave Wt superposed on a carrier wave Wc, with a comparative signal Rf and a voltage feedback circuit 12 that produces a feedback signal Vf; a one-input M-output demultiplexer 2 that receives an input signal of the voltage feedback circuit 12; M−1 low-speed response integrators 3 that calculate the respective integrals of M−1 output signals of the demultiplexer 2; an M-input one-output multiplexer 4 that receives the output signals of the M respective low-speed response integrators 3; a subtractor 9 that produces as the comparative signal Rf a difference between the feedback signal Vf and the output signal of the multiplexer 4; and a switching control circuit 7 that cyclically switches the output terminals of the demultiplexer 2 and the input terminals of the multiplexer 4 synchronously with a carrier wave Wc, and that selects the output signals of the integrators 3 or a 0 as an input of the subtractor 9.

The A/D converter 1' is a ΔΣ type A/D converter designed to manipulate 12 bits or 14 bits. In the block diagram, reference numerals F(S) and G(S) each denote a filter.

The voltage feedback circuit 12 includes an attenuator 12a and a high-speed response integrator 12b.

The attenuator 12a adjusts the levels of two signals a difference of which is calculated by the subtractor 5, and has the capability of the amplifier 6 included in the first embodiment.

A time constant required by the low-speed response integrators 3 is larger than the cycle Tc of a carrier wave, for example, ten times larger than the cycle Tc.

The number M of output terminals of the demultiplexer 2 and the number M of input terminals of the multiplexer 4 are, for example, 21. The number M−1 of low-speed response integrators 3 is, for example, 20.

One of the output terminals of the demultiplexer 2 is left unused, and the other output terminals are connected to the respective low-speed response integrators 3. A 0 is applied to one of the input terminals of the multiplexer 4, and the other input terminals are connected to the respective low-speed response integrators 3. The input terminal of the multiplexer 4 to which a 0 is applied has the capability of the mode selection switch 8 included in the first embodiment.

On the other hand, the switching control circuit 7 can select any of the low-speed response integrators 3 as those to be cyclically switched. In other words, although twenty low-speed response integrators 3 are included, the number N of low-speed response integrators actually employed corresponds to a quotient of a sampling rate fs, which is supported by the A/D converter 1, by a carrier frequency fc.

For example, if the sampling rate fs is 40 MHz and the carrier frequency fc is 2 MHz, since the number N of low-speed response integrators is 20, all of the twenty low-speed response integrators 3 are employed. On the other hand, if the sampling rate fs is 40 MHz and the carrier frequency fc is 4 MHz, since the number N of low-speed response integrators is 10, a half of the twenty low-speed response integrators 3 is employed.

If the A/D conversion circuit with a carrier frequency removing feature 100 is incorporated in a receiving system included in a diagnostic ultrasound system, when a pulsed Doppler mode is designated, the switching control circuit 7 switches the input terminals of the multiplexer 4 so that the multiplexer 4 will transmit a 0. The A/D converter 1 is therefore designed to offer a dynamic range that is wide enough to detect the amplitude which the analog signal Ai exhibits in the pulsed Doppler mode. Moreover, the attenuator 12a passes a signal but does not attenuate it.

On the other hand, when a continuous-wave Doppler mode is designated, the switching control circuit 7 switches the output terminals of the demultiplexer 2 so that an input signal of the voltage feedback circuit 12 will be cyclically transferred from the demultiplexer 2 to the low-speed response integrators 3, and switches the input terminals of the multiplexer 4 so that the output signals of the respective low-speed response integrators 3 will be cyclically transferred from the multiplexer 4. A switching time τ shall correspond to a quotient of the cycle Tc of a carrier wave by the number N of low-speed response integrators 3.

In the A/D conversion circuit with a carrier frequency removing feature 200 according to the second embodiment, a signal having a carrier-frequency component removed therefrom is converted into digital data by the A/D converter 1. Therefore, an A/D converter designed to manipulate, for example, 12 bits or 14 bits can offer a dynamic range that is wide enough to handle a component having undergone a Doppler shift. A compact low-cost configuration ensues. Moreover, even a deformed carrier wave Wc can be fully removed.

Many widely different embodiments of the invention may be configured without departing from the spirit and the scope of the present invention. It should be understood that the present invention is not limited to the specific embodiments described in the specification, except as defined in the appended claims.

The invention claimed is:

1. An A/D conversion circuit with a carrier frequency removing feature, comprising:
    an A/D converter including a voltage comparator that compares a first signal with a feedback signal and a voltage feedback circuit that produces the feedback signal;
    a one-input N-output demultiplexer that receives the feedback signal;
    N integrators each of which calculates the integral of values represented by each of N output signals of the demultiplexer;
    an N-input one-output multiplexer that receives the output signals of the N respective integrators;
    a subtractor that produces a difference between an analog signal, which has a signal wave superposed on a carrier wave, and the output signal of the multiplexer;
    an amplifier that amplifies the output signal of the subtractor to produce the first signal; and a switching control circuit that cyclically switches the input terminals of the multiplexer and the output terminals of the demultiplexer synchronously with the carrier wave.

2. The A/D conversion circuit with a carrier frequency removing feature according to claim 1, wherein the A/D converter is a ΔΣ type A/D converter.

3. The A/D conversion circuit with a carrier frequency removing feature according to claim 1, wherein a time constant required by the integrators is larger than the cycle of a carrier wave.

4. The A/D conversion circuit with a carrier frequency removing feature according to claim 1, wherein the number N of integrators corresponds to a quotient of a sampling rate, which is supported by the A/D converter, by a carrier frequency.

5. The A/D conversion circuit with a carrier frequency removing feature according to claim 1, wherein a switching time at intervals of which the switching control circuit performs switching corresponds to a quotient of the cycle of a carrier wave by the number N of integrators.

6. The A/D conversion circuit with a carrier frequency removing feature according to claim 1, wherein the switching control circuit can select any of the integrators as those to be cyclically switched.

7. The A/D conversion circuit with a carrier frequency removing feature according to claim 1, wherein the A/D converter is an A/D converter designed to manipulate 12 bits or 14 bits.

8. The A/D conversion circuit with a carrier frequency removing feature according to claim 1, further comprising a mode selection switch that selects as the first signal either the analog signal or the output signal of the subtractor.

9. An A/D conversion circuit with a carrier frequency removing feature, comprising:
    an A/D converter including a voltage comparator that compares an analog signal, which has a signal wave superposed on a carrier wave, with a comparative signal and a voltage feedback circuit that produces the feedback circuit;
    a one-input N-output demultiplexer that receives the input signal of the voltage feedback circuit;
    N integrators each of which calculates the integral of values represented by each of N output signals of the demultiplexer;
    an N-input one-output multiplexer that receives the output signals of the N respective integrators;
    a subtractor that produces as the comparative signal a difference between the feedback signal and the output signal of the multiplexer; and
    a switching control circuit that cyclically switches the input terminals of the multiplexer and the output terminals of the demultiplexer synchronously with the carrier wave.

10. The A/D conversion circuit with a carrier frequency removing feature according to claim 9, wherein the A/D converter is a ΔΣ type A/D converter.

11. The A/D conversion circuit with a carrier frequency removing feature according to claim 9, wherein the voltage feedback circuit includes an attenuator.

12. The A/D conversion circuit with a carrier frequency removing feature according to claim 9, wherein a time constant required by the integrators is larger than the cycle of a carrier wave.

13. The A/D conversion circuit with a carrier frequency removing feature according to claim 9, wherein the number N of integrators corresponds to a quotient of a sampling rate, which is supported by the A/D converter, by a carrier frequency.

14. The A/D conversion circuit with a carrier frequency removing feature according to claim 9, wherein a switching time at intervals of which the switching control circuit performs switching corresponds to a quotient of the cycle of a carrier wave by the number N of integrators.

15. The A/D conversion circuit with a carrier frequency removing feature according to claim 9, wherein the switching control circuit can select any of the integrators as those to be cyclically switched.

16. The A/D conversion circuit with a carrier frequency removing feature according to claim 9, wherein the A/D converter is an A/D converter designed to manipulate 12 bits or 14 bits.

17. The A/D conversion circuit with a carrier frequency removing feature according to claim 9, further comprising a mode selection means for selecting either the output signals of the integrators or a 0 as an input of the subtractor.

* * * * *